United States Patent [19]
Shiraishi

[11] Patent Number: 5,379,090
[45] Date of Patent: Jan. 3, 1995

[54] PROJECTION EXPOSURE APPARATUS

[75] Inventor: Naomasa Shiraishi, Kawasaki, Japan

[73] Assignee: Nikon Corporation, Tokyo, Japan

[21] Appl. No.: 20,803

[22] Filed: Feb. 22, 1993

[30] Foreign Application Priority Data

Feb. 25, 1992 [JP] Japan .................. 4-037897

[51] Int. Cl.⁶ .................. G03B 27/54; G03B 27/42
[52] U.S. Cl. .................. 355/67; 355/53
[58] Field of Search .................. 355/53, 67

[56] References Cited

U.S. PATENT DOCUMENTS 5,121,160 6/1992 Sano et al. .................. 355/53

FOREIGN PATENT DOCUMENTS 61-91662 5/1986 Japan .

Primary Examiner—Richard A. Wintercorn
Attorney, Agent, or Firm—Shapiro and Shapiro

[57] ABSTRACT

An apparatus includes an illumination system for illuminating a pattern formed on a mask with exposure light, a projection optical system for focusing and projecting an image of the mask pattern on a photosensitive substrate, and a stop member located on or near a plane having a Fourier transform relationship with a pattern surface of the mask. The illumination system has a variable optical member for setting variable the size of the exposure light passing through the plane having the Fourier transform relationship with the pattern surface of the mask. The stop member shields or reduces a portion near the central portion of the exposure light.

19 Claims, 3 Drawing Sheets

PROJECTION EXPOSURE APPARATUS

BACKGROUND OF THE INVENTION

1. Field of the Invention

The present invention relates to a projection exposure apparatus used in the manufacture of semiconductor integrated circuits or liquid crystal displays.

2. Related Background Art

In a conventional projection exposure apparatus, an attempt has been made to change the incident angle range (so-called $\sigma$ value = (numerical aperture of illumination light)/(numerical aperture of projection optical system)) of illumination light on a reticle pattern so as to increase the resolving power. A change in $\sigma$ value is generally realized by arranging a light-shielding member (stop) near a Fourier transform plane for a reticle pattern in an illumination optical system. A method (annular illumination method) of shielding or reducing a central portion of illumination light for setting an incident angle range on a Fourier transform plane can also be realized by adding a light-shielding member (light-reducing member).

A phase-shifting method has recently been proposed, and a phase shift reticle for realizing this method has become popular. For this reason, an illumination system having a small $\sigma$ value suitable for a phase-shifting method is required in a projection exposure apparatus. The annular illumination method has also become popular, and an appropriate annular illumination system is required. In either method, a higher resolving power and a larger focal depth can be obtained than those of a conventional exposure method. However, in the change method using the conventional light-shielding member as described above, a loss in illumination light amount upon partial light-shielding of the illumination light using the light-shielding member becomes large. The illumination intensity on a photosensitive substrate (wafer) is decreased to undesirably prolong the exposure time. The processing capacity per unit time in the projection exposure apparatus is decreased, resulting in a practical problem.

SUMMARY OF THE INVENTION

It is an object of the present invention to provide a projection exposure apparatus capable of changing the $\sigma$ value and reducing illuminance in an illumination system capable of performing annular illumination.

According to the present invention, a variable optical member (6–10) for changing the size (beam diameter) of exposure light within a plane (12) having a Fourier transform relationship with a pattern surface of a mask (20) in an illumination system (1–19) for illuminating the mask (reticle 20) with exposure light is provided. A stop member (13; 13A; 13B; 131–134) for shielding or reducing the central portion of the exposure beam is arranged on or near the Fourier transform plane (12). A secondary source image is generally formed on the Fourier transform plane within the illumination system. The variable optical member serves to change the size of the secondary source image.

In the illumination system of the projection exposure apparatus, generally, illumination light emitted from a light source such as a mercury lamp is transmitted through an optical system to form a secondary source, and the secondary source image is formed on a reticle pattern. The radiation angle range of light incident on the reticle is determined by the size of the secondary source and a synthetic focal length of the optical system from the secondary source to the reticle. In a conventional arrangement, a light-shielding member ($\sigma$ stop) is arranged at this secondary source to limit the size of the secondary source, thereby limiting the incident angle range of the light incident on the reticle.

To the contrary, according to the present invention, an optical system for forming a secondary source is a variable optical system (zoom system) to change the size of the secondary source. The incident angle range of the illumination light on the reticle can be set variable without causing a loss in light amount. According to the present invention, it is possible to add a conventionally used light-shielding member. In the variable optical system (zoom system) described above, the size of the secondary source can be proportionally enlarged or reduced, but the shape of the secondary source cannot be changed. Therefore, a light-shielding member may be added. In particular, when the central portion (near the optical axis of the illumination system) of the secondary source is shielded or reduced to obtain annular illumination, the resolving power and the focal depth in the projection optical system can be increased. In this case, since the peripheral portion of the illumination beam (secondary source) does not require the conventional light-shielding member ($\sigma$ stop), the loss in illumination light amount can be smaller than that in the conventional case. That is, although a loss in light amount upon formation of annular illumination occurs, even if the annular ratio is set to be 0.5 ((numerical aperture of light-shielding portion)/(numerical aperture of outer diameter of illumination light)), the loss is only 25%. To the contrary, when the $\sigma$ value is set variable using the conventional $\sigma$ stop and is changed from 0.7 to 0.3, the loss in light amount is about 80%. In addition, a loss also occurs upon formation of annular illumination. According to the present invention, since the outer diameter of the illumination beam distribution on the Fourier transform plane is defined by the variable optical member (zoom system), the loss in light amount by limitation of the $\sigma$ value (outer diameter) rarely occurs.

DESCRIPTION OF THE PREFERRED EMBODIMENTS

Figure 1:
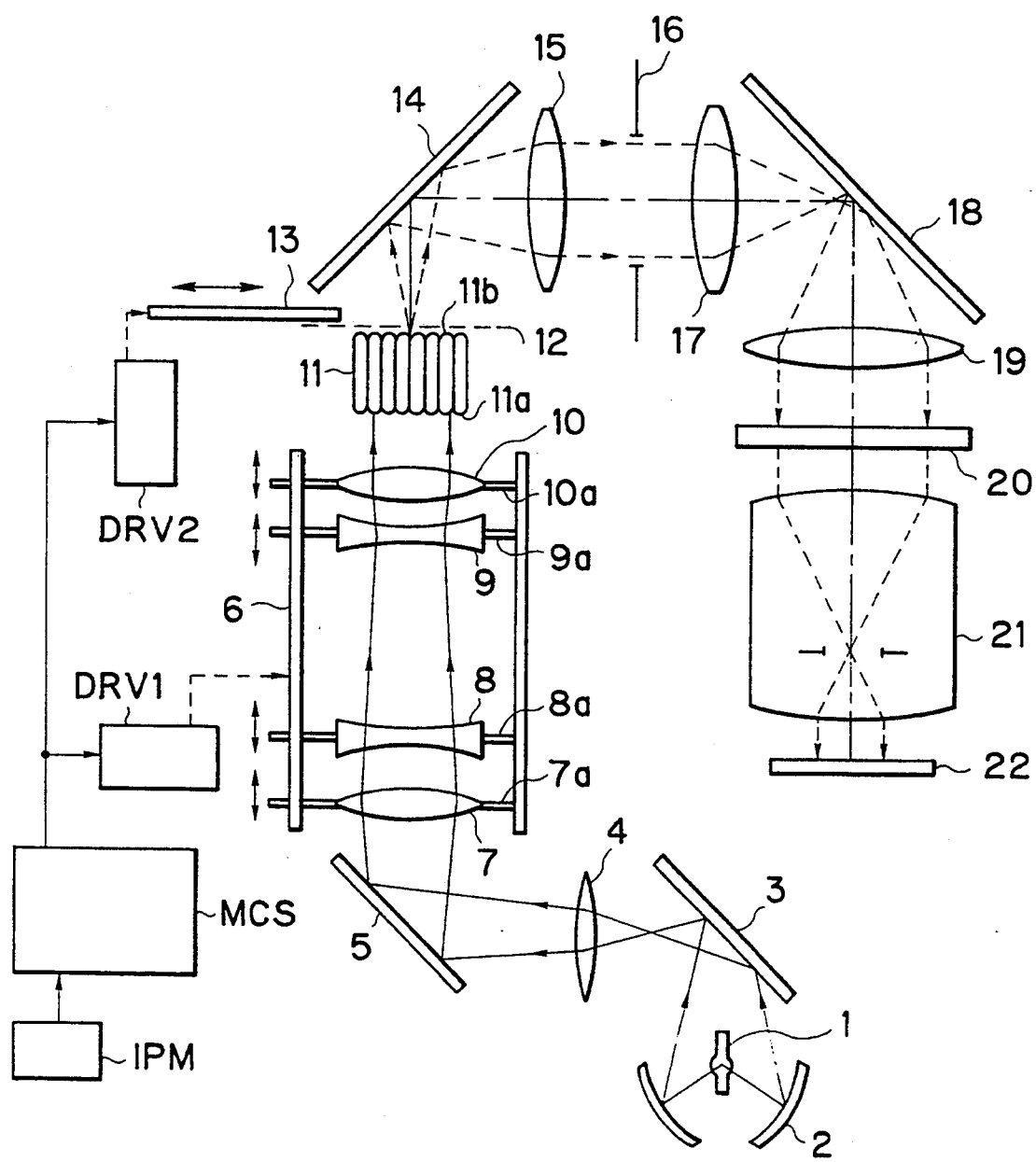
FIG. 1 is a view showing an arrangement of a projection exposure apparatus according to an embodiment of the present invention.

FIG. 1 shows an embodiment of the present invention. Exposure illumination light emitted from a mercury lamp 1 serving as a light source is focused by an elliptical mirror 2 and is transmitted through a variable optical system (zoom optical system) having optical members 7 to 10 through mirrors 3 and 5 and a relay lens 4. The light is converted as an almost parallel beam which reaches a fly-eye lens 11. The zoom optical system (7 to 10) is arranged such that the optical members 7, 8, 9, and 10 are movable in the light axis direction in a support member 6 through holders 7a, 8a, 9a, and 10a. The optical members 7, 8, 9, and 10 are moved to constitute a zoom system. The size (diameter) of the beam incident on an incident surface 11a of the fly-eye lens (optical integrator) 11 is set variable by a variable magnification of the zoom system while the almost parallel state of the beam is maintained. A driver DRV1 independently drives the holders 7a, 8a, 9a, and 10a in accordance with commands from a main control system MCS.

An exit surface 11b of the fly-eye lens 11 corresponds to an optical Fourier transform plane 12 of a reticle 20. A secondary source is formed on the plane 12 by the fly-eye lens 11. At this time, the size (diameter) of the secondary source almost corresponds (almost proportional) to the diameter of the illumination beam on the incident surface 11a of the fly-eye lens 11. By a variable magnification operation using the optical members 7, 8, 9, and 10 of the zoom system, the size (the substantial number of elements through which the illumination beam in the fly-eye lens 11 passes) of the secondary source can be set variable.

The illumination light emitted from the fly-eye lens 11 is guided through mirrors 14 and 18, relay lenses 15 and 17, and a condenser lens 19 to illuminate the reticle 20 with a uniform illuminance distribution. The pattern on the reticle 20 is exposed and transferred to a wafer 22 through a projection optical system 21. A field stop (reticle blind) 16 for limiting the illumination area on the reticle 20 is also provided in FIG. 1. Light rays represented by broken lines in FIG. 1 represent a beam from a secondary source as one point on the optical axis of the fly-eye lens 11.

Figure 2A:
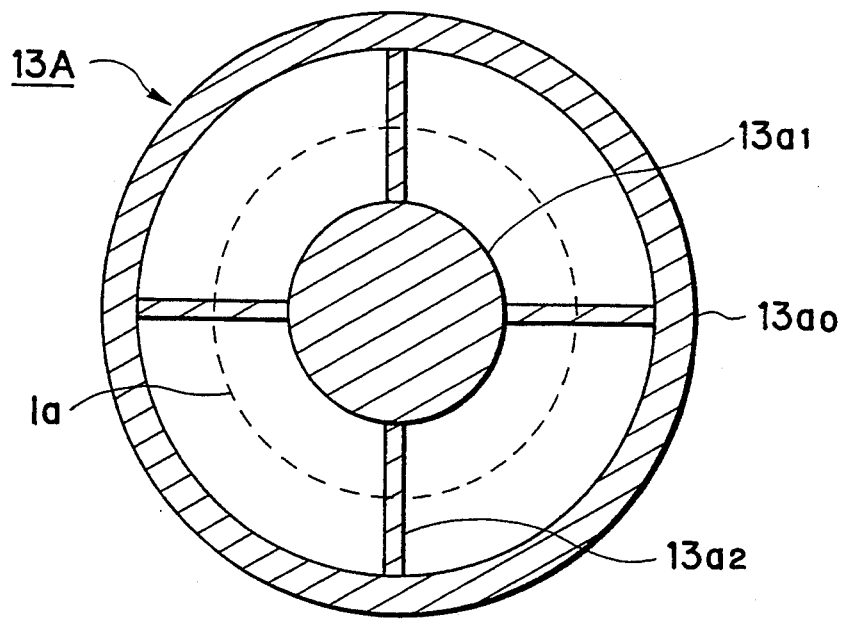
FIGS. 2A and 2B are views showing the shapes of stops for annular illumination.
Figure 2B:
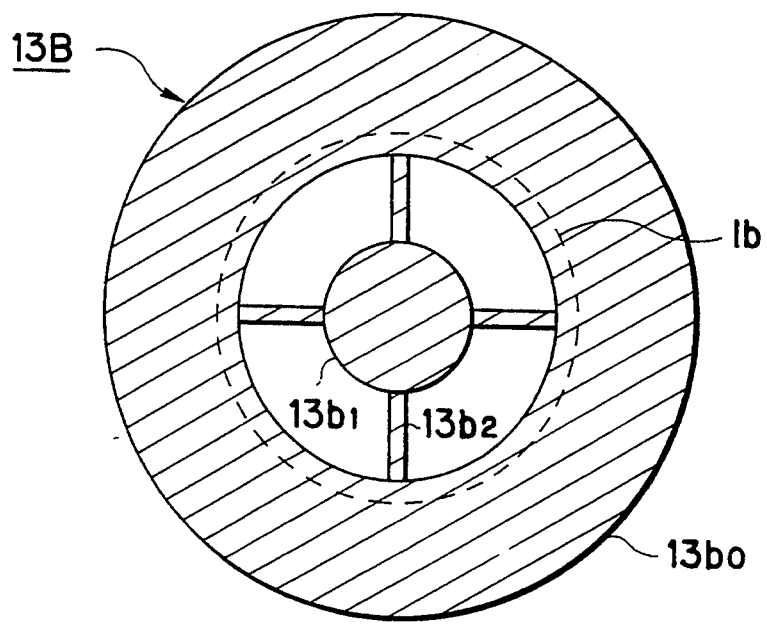

A stop 13 exchangeable by a driver DRV2 is arranged near the exit surface 11b of the fly-eye lens 11. The stop 13 is a stop for shielding the central portion of the illumination beam passing through the Fourier transform plane 12 to realize annular illumination. The shapes of the stop 13 are exemplified in FIGS. 2A and 2B. Referring to FIG. 2A, a stop 13A is constituted by an annular (ring-like) outer frame $13a_0$, a circular central light-shielding portion $13a_1$, and a holder $13a_2$. Note that the illumination beam (variable by the zoom optical system) in FIG. 2A is present within a circle Ia represented by a broken circle. That is, the outer frame $13a_0$ is sufficiently larger than an illumination beam Ia. Even if the illumination beam Ia becomes large by the optical elements 7, 8, 9, and 10 of the zoom system, the beam is not shielded by the outer frame $13a_0$. On the other hand, a stop 13B shown in FIG. 2B is constituted by an outer frame $13b_0$, a central light-shielding portion $13b_1$, and a holder $13b_2$. The inner diameter of the outer frame $13b_0$ is smaller than the diameter of an illumination beam Ib passing through the stop 13B, thereby light-shielding the peripheral portion of the illumination beam.

The light amount distribution on the incident surface 11a of the fly-eye lens 11 in FIG. 1 is almost flat (uniform) at its central portion, but is abruptly declined at its peripheral portion. For this reason, when the illumination beam passing through the zoom system is directly used, the illuminance evening effect of the fly-eye lens 11 is weakened, and illuminance uniformity on the reticle 20 is degraded. In order to prevent this, the stop 13B shown in FIG. 2B is preferably used. When the peripheral portion of the illumination beam is shielded, the illumination light amount is decreased accordingly. If the light amount has a higher priority than the illuminance uniformity, the aperture 13A in FIG. 2A is preferably used.

Figure 3:
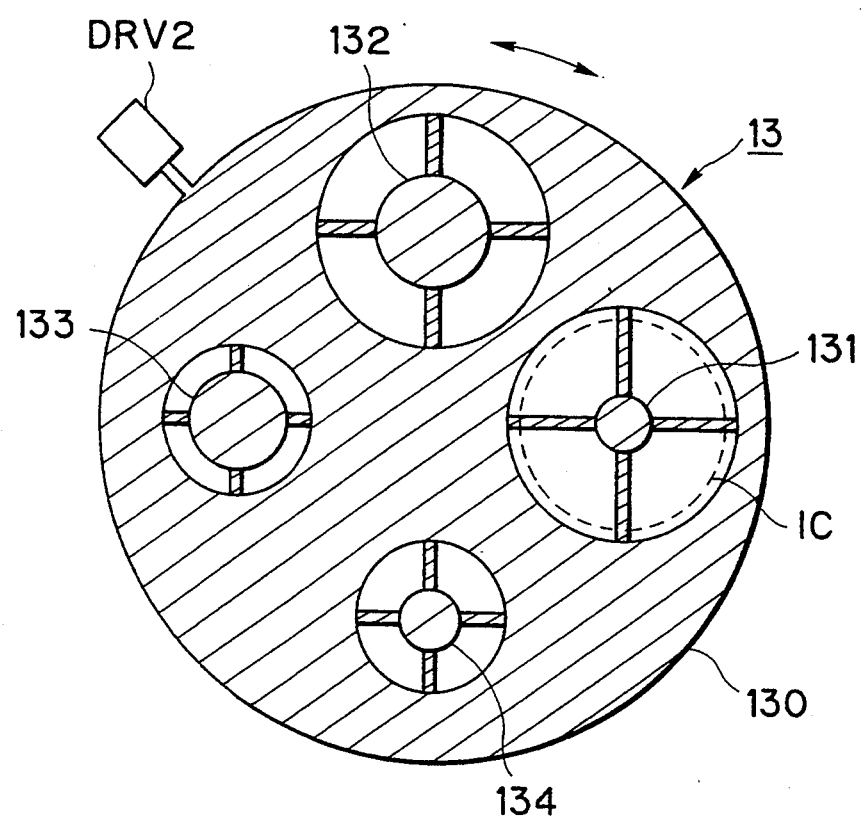
FIG. 3 is a view showing a stop exchange mechanism for setting annular illumination conditions variable.

FIG. 3 shows an arrangement in which the stop 13 is exchangeable. A light-shielding holding member 130 has a turret structure, and four stops 131, 132, 133, and 134 can be exchanged by rotating the holding member 130 by the driver DRV2, so that the stops are selectively inserted into or removed from an illumination light path Ic. The four stops have different shapes. The shape of each stop is not limited to shield the central portion of the illumination beam but may include an outer diameter stop ($\sigma$ stop). These stops are exchangeably used in accordance with the magnifications of the zoom optical system. Even if the beam diameter is changed by the zoom optical system, the stop may not be exchanged. The exchange and change described above may be set when an operator inputs data to the main controller MCS of the exposure apparatus through an input unit (e.g., a keyboard) IPM. Alternatively, information (pattern information or illumination condition information) such as a bar code may be added to the reticle 20 in advance, and the exposure apparatus may read this information to automatically set the illumination conditions.

If the input unit IPM is a bar code reader, the main controller MCS supplies drive commands to the drivers DRV1 and DRV2 in accordance with information read by the input unit IPM, and the distribution of the exposure beam within the Fourier transform plane 12 is set in an optimal state. More specifically, in this embodiment, the outer diameter of the exposure beam on the Fourier transform plane 12 is defined by the optical members 7 to 10 of the zoom optical system. At the same time, the inner diameter of the exposure beam is defined by the stop 13. The loss in light amount upon formation of annular illumination can be minimized. To change the annular ratio, the stop 13 is not exchanged, and at least one of the optical members 7 to 10 of the zoom optical system is driven to change only the outer diameter. Alternatively, the optical members 7 to 10 of the zoom optical system are not driven and the stop 13 is exchanged to change only the inner diameter; or the stop 13 is exchanged and at least one of the optical members 7 to 10 of the zoom optical system is driven to change both the inner and outer diameters. If the reticle 20 is constituted by a phase shift reticle, the stop 13 is removed from the illumination optical path by the driver DRV2, and at the same time, at least one of the optical members 7 to 10 of the zoom optical system is driven by the driver DRV1, thereby setting the $\sigma$ value to fall within the range of about 0.1 to 0.4.

In the above embodiment, the optical members 7 to 10 constituting the zoom optical system are arranged between the relay lens 4 (mirror 5) and the fly-eye lens 11 to set the outer diameter (i.e., the coherence factor $\sigma$ value of the illumination system) of the exposure beam within the Fourier transform plane 12 variable. However, the zoom optical system suitably applied to the present invention is not limited to the above arrangement. At least one optical member located between the light source 1 and the Fourier transform plane 12 on which the exit surface 11a of the fly-eye lens 11 is located need only be constituted by a variable system. For example, the fly-eye lens 11 may be constituted by a variable magnification system.

The transmittances of the stops shown in FIGS. 2A, 2B, and 3 need not be zero, and the stops may be made of a material for reducing the light amount. The shape of the central light-shielding portion need not be circular, but may be a rectangular. Since the secondary source image is formed at almost the central portion of each of a plurality of lens elements constituting the fly-eye lens 11, the edge of the central light-shielding portion preferably conforms to the arrangement of the lens elements.

What is claimed is:

1. A projection exposure apparatus comprising:
   an illumination system for illuminating a pattern formed on a mask, said illumination system having a variable optical member for variably setting a size of a light beam passing through a plane having a Fourier transform relationship with a pattern surface of said mask and a stop member for shielding or reducing the light beam in a central portion thereof in order that distribution of light intensity of said light beam on or near the plane having the Fourier transform relationship is such that light intensity is higher in a peripheral portion of the light beam than in the central portion, and
   a projection optical system for projecting an image of the pattern of said mask on a photosensitive substrate.

2. An apparatus according to claim 1, wherein said illumination system has an optical integrator for making uniform an illuminance distribution of the light beam on said mask, and said variable optical member is constituted by a variable optical system for variably setting a diameter of the light beam incident on said optical integrator.

3. An apparatus according to claim 2, wherein
   said stop member is arranged to variably change a size of a light-shielding or light-reducing portion near the central portion of the light beam, and
   further comprising changing means for changing the size of the light-shielding or light-reducing portion in synchronism with a change in beam diameter by said variable optical member.

4. An apparatus according to claim 3, wherein
   said stop member has a plurality light-shielding portions or light-reducing portions having different sizes, and
   said changing means comprises a drive mechanism, interlocked with said stop member, for alternately locating said plurality of light-shielding or light-reducing portions on or near the Fourier transform plane.

5. An apparatus according to claim 2, wherein said optical integrator is a fly-eye type integrator whose exit plane is disposed on or near said Fourier transform plane, and said stop member is disposed near the exit plane of said fly-eye type integrator.

6. An apparatus according to claim 1, wherein said stop member is disposed on or near the Fourier transform plane.

7. An apparatus according to claim 1, further comprising a holding member for holding said stop member such that the stop member can be inserted in and retracted from an optical path of said light beam.

8. An apparatus according to claim 7, wherein said holding member has a plurality of stop members with different sizes of light-shielding portions or light-reducing portions, and said plurality of stop members are alternately located on or near said Fourier transform plane.

9. An apparatus according to claim 8, further comprising:
   a drive member for driving at least one of said variable optical member and said holding member in order to change the light intensity distribution of said light beam on or near said Fourier transform plane, and
   a device for controlling said drive member in accordance with the pattern of said mask.

10. A projection exposure apparatus comprising:
    an illumination system for illuminating a pattern formed on a mask, said illumination system having a variable optical member for variably setting a size of a light beam passing through a plane having a Fourier transform relationship with a pattern surface of said mask and a variable stop member for partly shielding or reducing the light beam near a central position thereof in order that distribution of light intensity of said light beam on or near the plane having the Fourier transform relationship is such that light intensity is higher in a peripheral portion of the light beam than in the central portion;
    a projection optical system for projecting an image of the pattern of said mask on a photosensitive substrate; and
    an adjusting device for changing a light intensity distribution of the light beam on or near the Fourier transform plane by using at least one of said variable optical member and said variable stop member.

11. An apparatus according to claim 10, further comprising:
    a device for inputting information relating to the pattern of said mask;
    wherein said adjusting device sets the distribution of intensity of said light beam to an optimum distribution suitable for said mask in accordance with the inputted information.

12. An apparatus according to claim 10, wherein said variable stop member has a plurality of light-shielding portions or light-reducing portions having different sizes, and said plurality of light-shielding or light-reducing portions are alternately located on or near the Fourier transform plane.

13. A projection exposure apparatus comprising:
    a light source;
    an illumination optical system upon which a light beam from said source is incident for illuminating a mask having a pattern to be transferred onto a photosensitive substrate, the illumination optical system including a fly-eye type optical integrator which forms a secondary light source on or near a plane having a Fourier transform relationship with a surface of the pattern of said mask;
    a variable power optical system disposed between said light source and said Fourier transform plane for changing the size of said secondary source; and
    an optical member for shielding or reducing light from a central portion of said secondary source in order that distribution of light intensity of the secondary source is such that light intensity is higher in a peripheral portion than in the central portion.

14. An apparatus according to claim 13, wherein said variable power optical system includes a zoom optical system for changing the size of the light beam generated by said light source to be incident on said fly-eye type optical integrator.

15. An apparatus according to claim 13, wherein said optical member includes a member holding a plurality of light-shielding or light reducing portions having different sizes, and one of said plurality of light-shielding or light-reducing portions is disposed on or near said Fourier transform plane.

16. An illumination optical apparatus for illuminating a mask having a pattern to be transferred onto a photosensitive substrate in such a way that distribution of light intensity of a light beam on or near a plane having a Fourier transform relationship with a pattern surface of said mask is such that light intensity is higher in a peripheral portion of the beam than in a central portion, comprising:

a first member for variably setting a size of the light beam passing through said plane having the Fourier transform relationship; and a second member for shielding or reducing light of the central portion of said light beam.

17. An apparatus according to claim 16, wherein said second member is disposed on or near the plane having the Fourier transform relationship.

18. An apparatus according to claim 17, wherein said second member comprises an aperture diaphragm with the size of a light-shielding portion or light-reducing portion being variable.

19. An apparatus according to claim 17, wherein said second member includes a member for holding a plurality of light-shielding portions or light-reducing portions having different sizes.

* * * * *